US006897410B1

(12) United States Patent
Ho et al.

(10) Patent No.: US 6,897,410 B1
(45) Date of Patent: May 24, 2005

(54) DUAL STAGE PRE-HEATER

(75) Inventors: Albert Ho, San Francisco, CA (US);
Mike Carlomagno, Chico, CA (US);
Artem Mishin, San Francisco, CA (US)

(73) Assignee: Delaware Capital Formation, Inc., Wilmington, DE (US)

( * ) Notice: Subject to any disclaimer, the term of this patent is extended or adjusted under 35 U.S.C. 154(b) by 0 days.

(21) Appl. No.: 10/703,680

(22) Filed: Nov. 7, 2003

(51) Int. Cl.[7] .......................... B23K 1/012; B23K 1/018
(52) U.S. Cl. ....................... 219/385; 219/400; 219/392; 228/191
(58) Field of Search ................................ 219/385, 400, 219/392, 85.1, 85.16, 85.19; 228/191, 179.1–180.22; 392/379, 382

(56) References Cited

U.S. PATENT DOCUMENTS

| | | | | |
|---|---|---|---|---|
| 4,752,025 A | * | 6/1988 | Stach et al. | 228/191 |
| 5,309,545 A | * | 5/1994 | Spigarelli et al. | 392/379 |
| 5,560,531 A | * | 10/1996 | Ruszowski | 228/191 |
| 5,735,450 A | * | 4/1998 | Heim et al. | 228/191 |
| 5,853,622 A | | 12/1998 | Gallagher et al. | |
| 5,911,486 A | | 6/1999 | Dow et al. | |
| 5,993,500 A | | 11/1999 | Bailey et al. | |
| 6,084,214 A | | 7/2000 | Tallman et al. | |
| 6,193,774 B1 | | 2/2001 | Durdag et al. | |
| 6,201,930 B1 | * | 3/2001 | Close et al. | 228/191 |
| 6,229,124 B1 | | 5/2001 | Trucco | |
| 2003/0086089 A1 | | 5/2003 | Carlomagno et al. | |

* cited by examiner

Primary Examiner—Joseph Pelham
(74) Attorney, Agent, or Firm—Burns Doane Swecker & Mathis, L.L.P.

(57) ABSTRACT

A system for electronic component processing, including: a frame configured to hold a printed circuit board; a tool head connected to the frame, the tool head being configured to position an electronic component on top of the printed circuit board; a heater disposed in the tool head, the heater being configured to direct heat towards the electronic component; and a dual-stage pre-heater connected to the frame, the dual-stage pre-heater being configured to direct heat towards the printed circuit board, wherein the pre-heater comprises: a first stage configured to direct heat over a wide area of the printed circuit board; and a second stage configured to heat a focused region of the printed circuit board adjacent to the electronic component.

33 Claims, 4 Drawing Sheets

DUAL STAGE PRE-HEATER

TECHNICAL FIELD

The present invention relates in general to electronic component process assembly and re-work systems, and in particular to pre-heating systems for use when soldering or de-soldering electronic components on printed circuit boards.

BACKGROUND OF THE INVENTION

Electronic components are attached to printed circuit boards (PCBs) by soldered connections. When attaching or detaching electronic components, the solder connection to the PCB is heated to a temperature at which solder reflow occurs. However, performing a proper solder reflow operation is a much more complex task than simply heating up the solder to its reflow temperature. This is due to the fact that the temperature profile of the solder needs to be maintained within an appropriate narrow process window that changes over time. In other words, the temperature of the solder connecting the electronic component to the PCB must be maintained within an appropriate narrow temperature range, with this narrow temperature range being varied over time to achieve proper solder reflow conditions. Moreover, there are temperature considerations when dealing with the electronic component and the circuit board itself. For example, excess temperature differentials through the electronic component may tend to damage the electronic component. Damage can also be caused by simply subjecting the electronic component to excessively high temperatures for an extended period of time. It is also necessary to avoid excessive temperature differentials across the PCB to avoid causing warpage of the PCB itself. As such, there are numerous reasons that the working temperature ranges of the solder, the electronic component and the PCB must all be maintained within clearly defined limits.

During a typical assembly or re-work operation, the temperature of the solder is typically increased in a series of controlled steps or stages, with each stage accomplishing a particular function in the overall soldering reflow process. The first stage is simply applying a low temperature "preheat". This preheating stage removes any excess moisture from the PCB and the electronic component. Next, the temperature of the PCBA is raised during a "soak" stage at which time the temperature of the PCB is substantially equalized. Next, the temperature is raised during a "ramp" stage (resulting in rapid heating of the soldered connection, and activation of flux). Thereafter, the temperature is briefly stepped up to the actual "reflow" temperature stage. A cool down stage follows quickly thereafter.

During this process, it is important that the duration of time at which the solder temperature is actually in its "reflow" stage is not too long. This is due to the fact that such high temperatures (especially if prolonged) may tend to damage the electronic component itself. As a result, it is desired to raise the solder temperature just high enough to cause reflow, but only for a short period of time. As can be seen, the overall soldering reflow process necessitates operating within narrow temperature windows over time.

The above discussed problems are even more complicated when using today's lead-free solders. This is principally due to the fact that lead free solders have higher reflow temperatures. Therefore, it is necessary to heat lead-free solders to higher temperatures to achieve reflow. Yet, it is still important that maximum temperatures (or temperature differentials) are not exceeded so that PCB becomes warped. Consequently, working with lead-free solders requires operating within a much tighter temperature profile window, and thus, a much tighter temperature management and control system is required.

Various systems have been devised to provide heating to the solder connecting the electronic component to the PCB. Unfortunately, these existing systems all tend to suffer from various disadvantages.

A first type of system is a simple forced air convection system. Examples of such forced air convection systems include Summit 1100 made by SRT, Inc. of Connecticut. In such systems, a pre-heater is positioned below the PCB to direct heated air upwards against the bottom of the PCB, thereby raising the temperature of the PCB above ambient temperature. A forced air convection heater in the tool head is then used to heat the electronic component from above. The bulk of the heat supplied to the solder is actually supplied from above (i.e. from the heater in the tool head). It is this heat from above that actually causes the solder to reflow.

Unfortunately, these type of systems have disadvantages. For example, problems exist when the forced air convection pre-heater is either too large or too small (as compared to the PCB positioned thereabove). Specifically, if the pre-heater is too large, the system will be very thermally inefficient, since a large portion of the heat is simply lost around the sides of the PCB. Moreover, it is very uncomfortable for an operator to work with such a system since the heat is simply directed upwards into the operator's face and hands. Conversely, if the pre-heater is too small, most of the thermal output will be focused at the center of the PCB. This causes the PCB to have an uneven temperature profile thereacross (i.e.: in its X- and Y-axes). Such non-uniform temperatures across the PCB may tend to cause the PCB to warp or to deform. Since the same pre-heater is used to work on different sized electronic components and on different PCB's, the operator is constantly attempting to deal with the problem of the pre-heater being either too large or too small for the job at hand.

A second type of system uses infa-red heating of the PCB. Examples of such infa-red heating systems include the 936 A system made by Fonton Inc. of Taiwan. Infa-Red heating has its own particular disadvantages. For example, it is slow in controlling temperature changes. This makes it especially difficult to achieve a desired temperature profile, especially when handling lead-free solders which demand narrow temperature windows during their various solder reflow heating stages. A further disadvantage of infa-red heating is that it produces questionable temperature uniformity in the PCB itself. This is due at least in part to the fact that different surfaces of the PCB have different absorption characteristics under infa-red heating.

Another existing system uses "hot plate" pre-heaters to heat the PCB. Examples of such systems include systems made by Airvac Corporation, of Connecticut. Hot plate heating uses a heated metal plate that is placed under a PCB assembly to transfer heat thereto by radiation or natural convection. Unfortunately, hot plate heading has the disadvantage of being very slow to respond to changes in the hot plate set-point temperature. Therefore, it is slow in controlling temperature changes. This makes it especially difficult to achieve a desired solder temperature profile, especially when handling lead-free solders which demand narrow solder temperature windows during their various reflow heating stages.

Legislation requiring lead free solder is becoming mandatory. Unfortunately, as stated above, lead-free solders have higher reflow temperatures. However, should the working temperatures applied to the electronic components become too high, the electronic components may be damaged. As a result, it is necessary to perform component assembly and re-work within very narrow temperature process windows during the various stages of the solder re-flow process.

A further disadvantage of all the above discussed systems is that the bulk of the heating that actually causes the solder to reflow is the heating that is applied downwardly from a heater disposed in the tool head. Thus, the soldered connections (which are found at the bottom of the component) are predominantly heated by heat that is applied to the top of the component (and conducted downwardly through the component). A disadvantage of this approach is that large, unwanted temperature differentials occur in the component's Z-axis. Specifically, the top of the component must be raised to a higher temperature than is necessary to cause the solder to reflow. The greater the temperature differential through the electronic component, the greater the possibility that the component will become damaged.

What is instead desired is a component assembly and re-work system that provides a minimal Z-axis (i.e.: vertical) temperature differential through the component, while still providing controllable heating of the solder connection within narrow time and temperature parameters. It is further desirable that such a system minimize the X-axis and Y-axis (i.e.: horizontal) temperature differentials across the PCB, so as to minimize the potential for warpage of the PCB.

As will be explained below, the present invention provides such a system, and offers numerous other advantages.

SUMMARY OF THE INVENTION

In preferred aspects, the present invention provides a system for component assembly and re-work in which temperature differentials are minimized in each of the X-, Y- and Z-axes. This has the advantage of minimizing the potential for damage to the electronic component or unwanted changes in either of the electronic component or the PCB to which it is mounted.

In preferred aspects, the present invention also provides a system which is able to generally uniformly heat the PCB to avoid warpage of the board. In addition, however, the present invention is also able to apply a focused heating to the PCB at a location directly under where the component is mounted to the PCB. As a result, the present invention provides a system in which it is possible to provide a low temperature differential through the electronic component while maintaining a generally uniform board temperature.

This has the advantage of reducing the amount of top heat that is required from the heater in the tool head to cause the solder to reflow. Accordingly, the present system of focused top and bottom heating has the advantage of resulting in a lower temperature differential through the component in its Z-axis.

As will be shown, the present invention provides a system in which it is possible to switch between uniform heating of the underside of the PCB, and focused heating of the PCB directly under the electronic component. As will also be shown, preferred aspects of the present invention also provide a system which is able to accurately control the temperature of the solder connection at the electronic component/PCB interface within very narrow time and temperature parameters.

In preferred embodiments, uniform board heating is achieved with a first stage of a dual-stage pre-heater positioned below the PCB. This first stage can be used to direct air over a large region (preferably the entire surface) of the bottom of the PCB. The second stage of this dual-stage pre-heater can then be used to direct a focused stream of air towards a localized region of the bottom of the PCB directly below the electronic component. The present invention is, however, not so limited. For example, during the "pre-heat" and "soak" stages, the emphasis is on heating the PCB uniformly. This may be done by only using the first stage, but also may be done by using both the first and second stages together. In addition, these "pre-heat" and "soak" eating stages may also be accomplished by using the second stage alone (for example, when heating a small PCB). When the system enters the "ramp" and "reflow" stages, focused heat under the PCBA becomes important. Additional heat may be applied by raising the temperature, increasing the air flow or by turning on the second "focused" stage, or a combination of these approaches. What the present invention provides is a system that enables all of these different heating approaches.

An advantage of applying focused heat on the PCB at a location directly below the electronic component is that it reduces the amount of top heat that must be delivered from the heater in the tool head to cause the solder to reflow. This has the specific benefit of reducing the Z-axis temperature differential through the electronic component itself.

In preferred embodiments, the present invention provides a system for electronic component processing, including: a frame configured to hold a PCB; a tool head connected to the frame, the tool head being configured to position an electronic component on top of the PCB; a heater disposed in the tool head, the heater being configured to direct heat towards the electronic component; and a dual-stage pre-heater connected to the frame, the dual-stage pre-heater being configured to direct heat towards the PCB in general, and the electronic component specifically. Preferably, the dual-stage pre-heater comprises a first stage configured to generally uniformly heat the PCB, and a second stage configured to heat a focused region of the PCB adjacent to the electronic component. More generally, the dual-stage pre-heater comprises a first stage configured distribute heat over a wider area than the second stage. Thus, the second stage is configured to apply heat in a more focused region than the first stage. Both stages may be operated together, or independently of one another, or at different intensities. In preferred embodiments, each of the first and second stages of the dual-stage pre-heaters are forced air convection heater systems. The first and second stages of the pre-heater are preferably both positioned below the PCB such that the first stage can be used to uniformly heat the bottom of the PCB and then the second stage of the pre-heater can be used to apply a focused heat to the bottom of the PCB (directly underneath the electronic component positioned thereon) so as to assist in causing solder reflow at the electronic component/PCB interface.

In preferred aspects, the second stage of the pre-heater can be used to provide uniform heat during the first two heating stages (i.e. "pre-heat" and "soak"). During the final two heating stages (i.e.: "ramp" and "reflow") focused heat can be provided by changing the system air flow and/or temperature. In addition, large PCB's may require simultaneous operation of the first and second stages of the pre-heater to achieve uniform heating of the PCB and then change the heating rate of the second stage of the pre-heater when it is time for focused heat.

In preferred embodiments, the first and second stages of the dual-stage pre-heater supply heated air in flows that are concentric to one another. In optional preferred embodiments, a focusing chamber is connected to the output of the second stage of the pre-heater. The focusing chamber may be conical shaped. A second stage of the pre-heater that is moveable with respect to the first stage of the pre-heater is also contemplated, all keeping within the scope of the present invention.

In preferred embodiments, the dual-stage pre-heater further comprises a bowl, wherein each of the first and second stages of the pre-heater supply air flow into the bowl such that air flows in a vortex in the bowl. The bowl may optionally have two chambers, with each of the first and second stages of the pre-heater supplying air flow into one of the two chambers of the bowl.

The present invention also provides a dual-stage pre-heater for heating a PCB with an electronic component positioned thereon, including: a first forced air convection stage that may be used to uniformly heat a PCB, and a second forced air convection stage that may be used to heat a focused region of the PCB.

The present invention also provides a method of soldering or de-soldering an electronic component on a PCB, comprising: positioning an electronic component on top of a PCB; pre-heating the bottom of the PCB with a dual-stage pre-heater by: uniformly heating the bottom of the PCB with a first stage of the pre-heater, and heating a focused region of the PCB directly below the electronic component with the second stage of the pre-heater, and then heating the top of the electronic component with a heat source positioned above the electronic component.

DETAILED DESCRIPTION OF THE DRAWINGS

Figure 1:
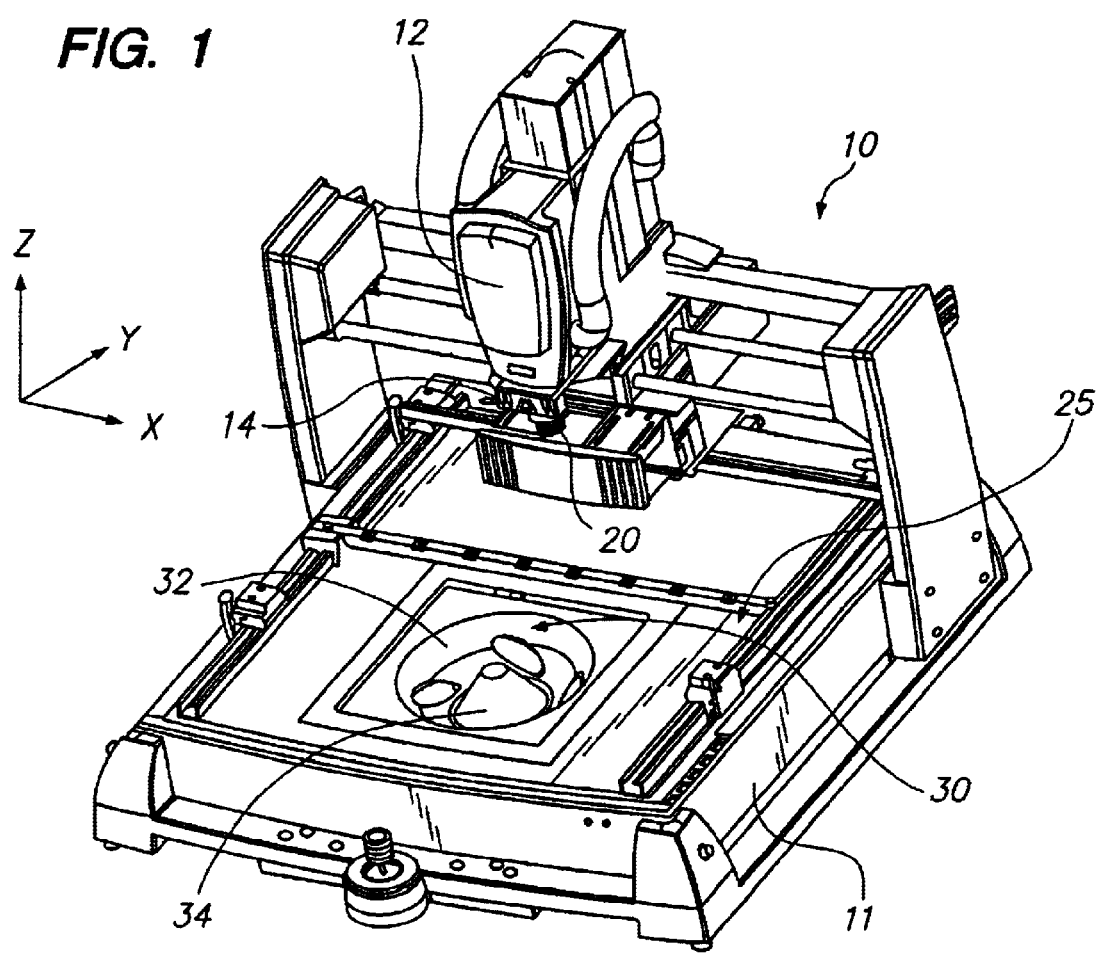
FIG. 1 is a perspective view of an electronic component assembly and re-work platform incorporating a dual-stage pre-heater in accordance with the present invention. (The dual-stage pre-heater is shown in dotted lines as it is located directly below a PCB supported by the system.)

FIG. 1 shows a perspective view of the present dual-stage pre-heater invention, as incorporated into a platform for component assembly or re-work. FIGS. 2 through 7 show various further aspects of the present dual-stage pre-heater invention.

Figure 4:
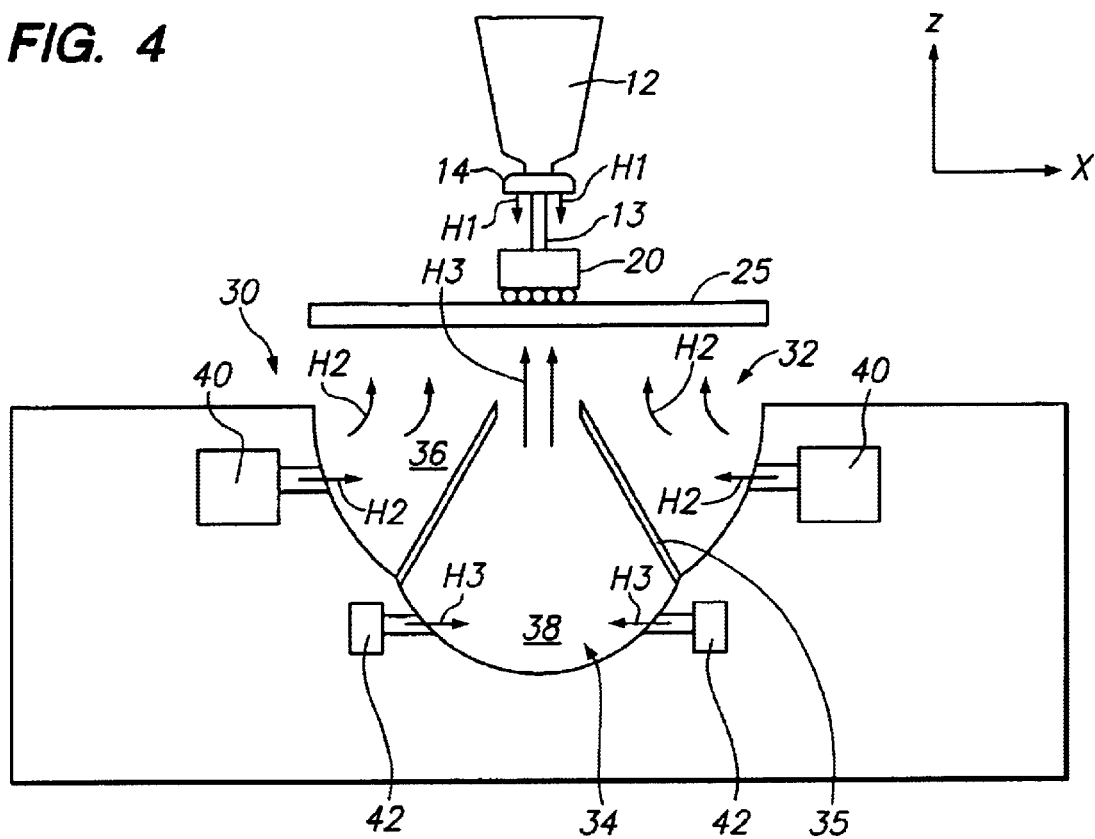
FIG. 4 is a schematic sectional side elevation view of the invention, showing its preferred method of use.
Figure 5:
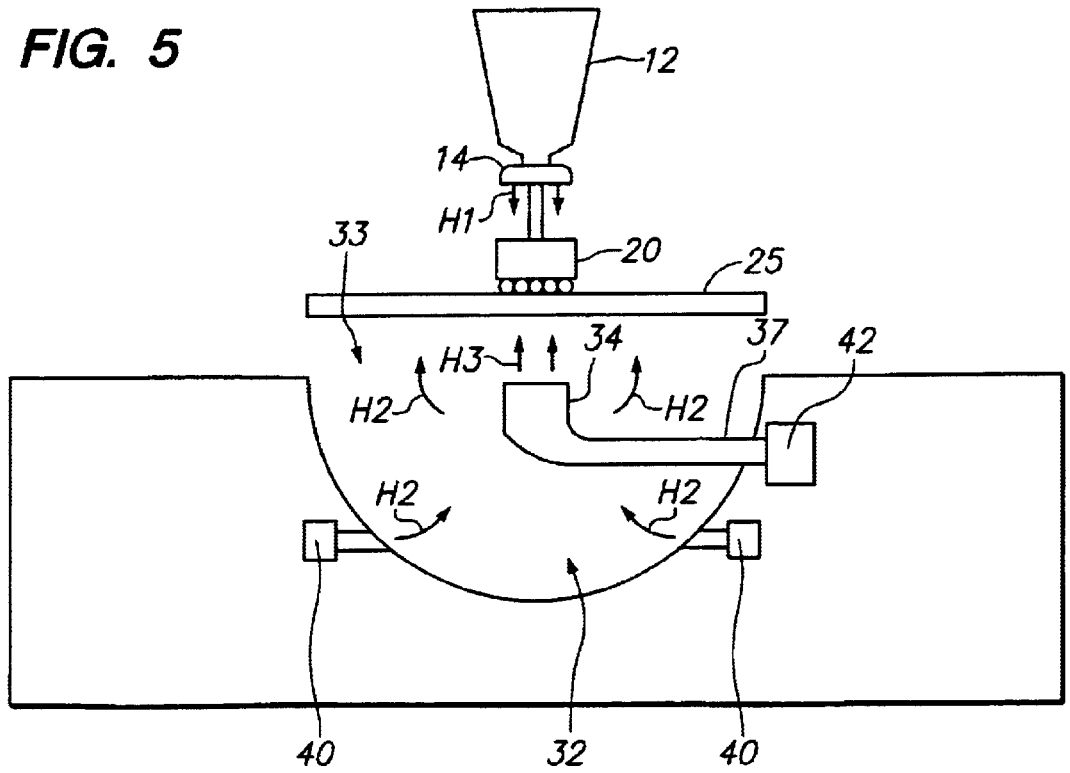
FIG. 5 is a schematic sectional side elevation view of an alternate embodiment of the invention.
Figure 6:
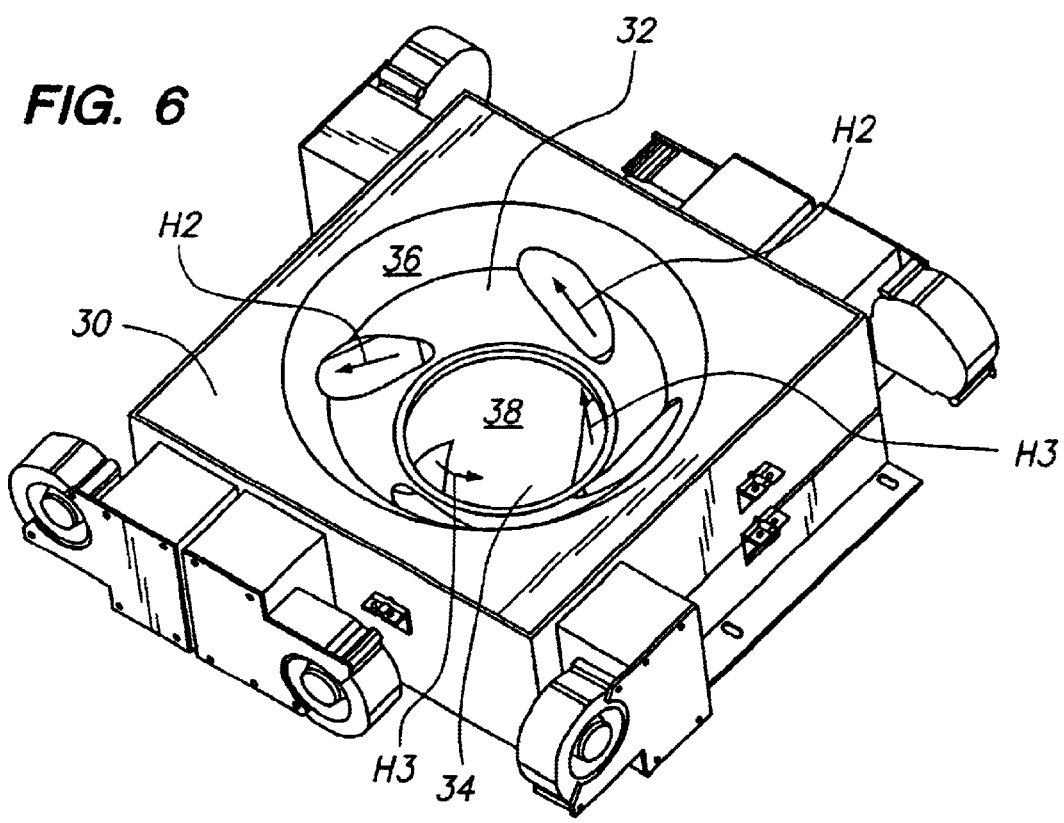
FIG. 6 is a perspective view of the pre-heater corresponding to the embodiment of FIG. 2.

Referring first to FIG. 1, a system or platform 10 for electronic component processing is provided. System 10 includes a frame 11 and a movable tool head 12 which is selectively positionable in both the X- and Y-directions. Tool head 12 is used to position and place an electronic component 20 onto a printed circuit board (PCB) 25. In preferred embodiments, tool head 12 is first moved to a desired position in the X- and Y-directions, such that electronic component 20 is positioned directly above the location at which it is to be soldered to PCB 25 (PCB 25 is also shown in FIGS. 4 and 5). Then, a retractable vacuum tube 13 is extended to lower electronic component 20 onto PCB 25 (see also FIGS. 4 and 5). In addition, tool head 12 may itself be moved vertically to assist in positioning electronic component 20 onto PCB 25.

Dual-stage pre-heater 30 is incorporated into platform 10 such that it is positioned below PCB 25, as shown. It is to be understood that dual-stage pre-heater 30 may be incorporated into various soldering assembly or re-work systems, all keeping within the scope of the present invention. It is also to be understood that dual-stage pre-heater 30 is by itself a novel invention and may be manufactured and sold for use in other existing systems. As such, the component platform illustrated as system 10 is merely exemplary.

Further discussion of the operation of exemplary system 10, and its various preferred optional features can be found by referring to co-pending U.S. patent application Ser. No. 10/053,512, filed Nov. 2, 2001. As explained therein, an X and Y positioning system found in system 10 enables movement of PCB 25 with respect to frame 11. However, the present invention is not so limited. For example, movement of pre-heater 30 with respect to a stationary PCB 25 is also contemplated within the scope of the present invention. In either embodiment, system 10 enables movement of PCB 25 with respect to pre-heater 30. Therefore, the location at which electronic component 20 is mounted to PCB 25 can easily be centered directly above pre-heater 30, thus ensuring that focused heat from pre-heater 30 is delivered to the underside of PBC 25 directly under electronic component 20. Consequently, the present invention provides a system that is flexible enough to cope with a large variation in PCB sizes.

A heater 14 (or the output from a heat source) is provided in tool head 12. Heater 14 is configured to direct heat downwardly towards the top of electronic component 20. Such heat is illustrated by air flow lines H1 in FIGS. 4 and 5. (It is to be understood that heater 14 may comprise a heater element and blower system positioned in tool head 12, or it may simply comprise an output port of a heating system located elsewhere in system 10.)

Dual-stage pre-heater 30 is connected to frame 11 with dual-stage pre-heater 30 being configured to direct heat upwards towards the bottom of PCB 25. Dual-stage pre-heater 30 comprises a first stage 32 and a second stage 34. First stage 32 and second stage 34 preferably both comprise forced air convection heater systems. However, the present invention is not so limited. For example, one or more of stages 32 or 34 could be an infra-red heater, or any other type of pre-heater. In such optional embodiments, it is preferred that one stage provides generally uniform PCB heating, and the other stage provides focused heating of electronic component 20. However, either or both of stage 32 or 34 may be used to provide heating in accordance with the preferred systems and methods of the present invention. Stages 32 and 34 may be operated independently of one another (and at varying intensities) to during the solder reflow process.

First stage 32 is configured to generally uniformly heat the bottom (or a substantial portion of the bottom) of PCB 25. As such, first stage 32 advantageously ensures a generally uniform temperature throughout PCB 25 in the X- and Y-directions. This is particularly advantageous in that it decreases the potential for warping of PCB 25. The heat from first stage 32 is illustrated by air flow lines H2 in FIGS. 2, 4 and 5.

Second stage 34 is preferably positioned to supply heated air flow concentrically within the heated air flow supplied by first stage 32, as shown. It is to be understood that although the entire second stage 34 may itself be physically positioned concentrically within first stage 32, it is instead possible that only the output path of the heated air flow supplied by second stage 34 be positioned concentrically within the output path of the heated air flow supplied by first stage 32. In optional embodiments, second stage 34 may comprise a movable, focused pre-heater. This embodiment may be particularly advantageous in addressing situations where electronic component 20 is positioned close to the edge of the PCB. Such an embodiment of the invention may make it possible to produce a smaller system.

Second stage 34 is preferably configured to only heat a focused region of PCB 25. Most preferably, this focused region is the region directly under electronic component 20. As will be explained, heater 14 and second stage 34 together advantageously provide focused heating on electronic component 20 from above and below, respectively. The heated air flow from second stage 34 is illustrated by air flow lines H3 in FIGS. 2, 4 and 5.

Figure 2:
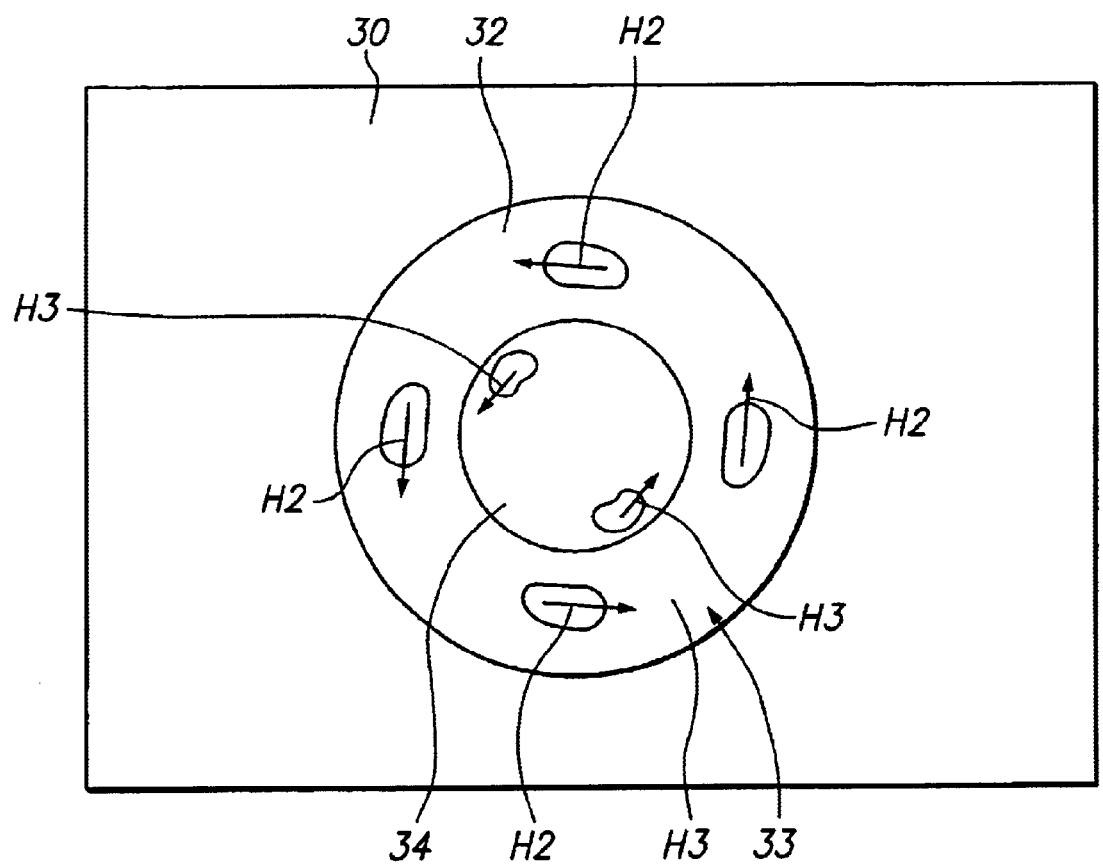
FIG. 2 is a top plan view of a first embodiment of the dual-stage pre-heater.
Figure 3:
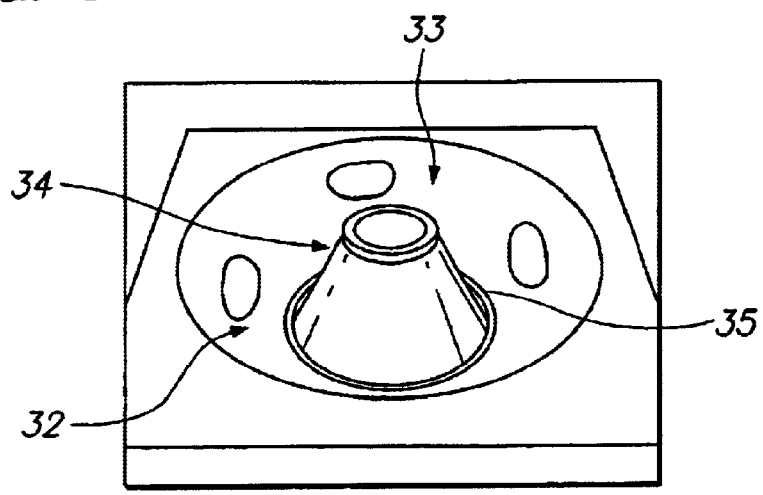
FIG. 3 is a perspective view of the dual-stage pre-heater of FIG. 2, further including a conical shaped focusing chamber connected to the output of the second stage of the dual-stage pre-heater.

As seen in FIGS. 2 through 6, pre-heater 30 may optionally comprise a bowl 33 with each of first stage 32 and second stage 34 supplying heated air flow into bowl 33. As can be seen in FIGS. 2 and 3, the heated air supplied by stages 32 and 34 can be introduced into bowl 33 such that the air flows in a vortex in bowl 33. As shown in FIG. 4, bowl 33 may have two chambers 36 and 38 with each of first and second stages 32 and 34 supplying air flow into chambers 36 and 38, respectively. It is to be understood that the present invention is not so limited. For example, a single chamber can instead be used to receive the heated air supplied by both stages 32 and 34.

Figure 7:
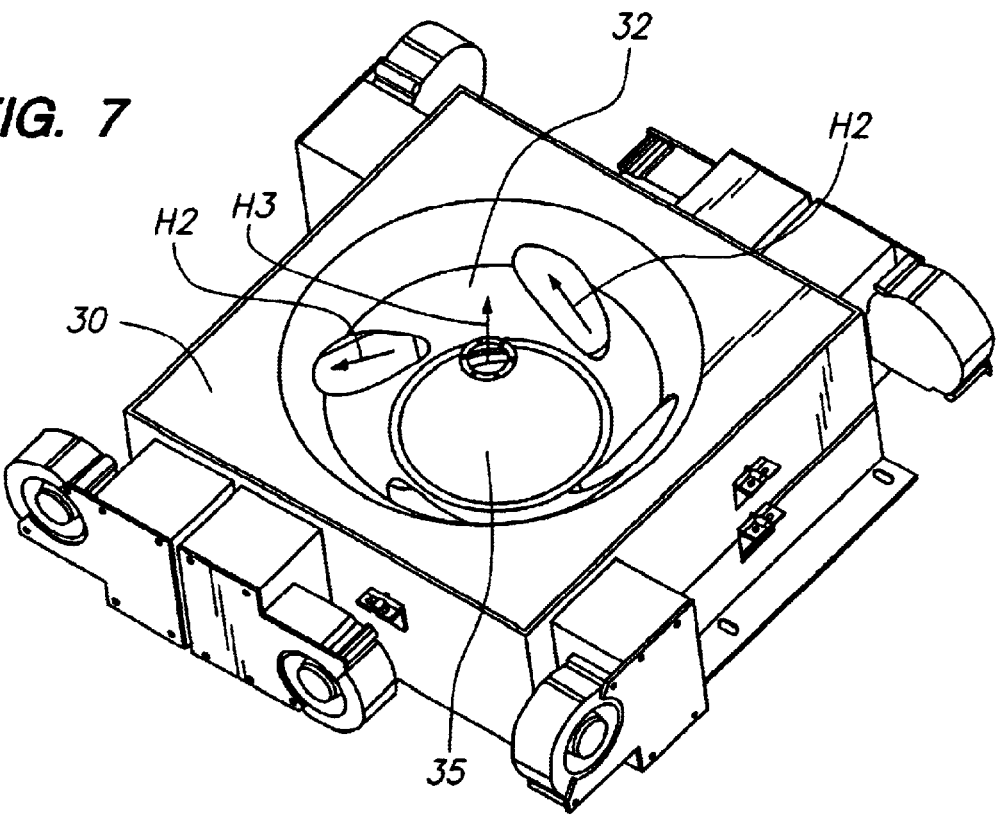
FIG. 7 is a perspective view of the pre-heater corresponding to the embodiment of FIG. 4.

FIGS. 3, 5 and 7 show an embodiment of the invention further including an optional focusing chamber 35 connected to the output of the second stage 34 of pre-heater 30. As can be seen, focusing chamber 35 may simply comprise a cone having an open top end. Focusing chamber 35 assists in focusing heated air flow from second stage 34 on the underside of PCB 25 in a focused region directly under electronic component 20.

As can also be seen schematically in FIGS. 4 and 5, each of first and second stages 32 and 34 may preferably have dedicated heating elements and blower systems 40 and 42, respectively. Various individual configurations and placements of heating elements and blowers may be used for systems 40 and 42. Thus, it is to be understood that systems 40 and 42 are illustrated only schematically. Alternate embodiments and placements of these systems are contemplated, all keeping within the scope of the present invention.

Most preferably, systems 40 and 42 can be operated independently from one another under operator control. As such, stages 32 and 34 (or systems 40 and 42) preferably each comprise a dedicated temperature sensor and controller. Thus, each of first stage 32 and second stage 34 are preferably independently controllable by an operator. As a result, it is possible for an operator to easily switch between heat generation with first and second stages 32 and 34. This may be advantageous in conserving system power, or in managing temperature profiles.

FIG. 5 shows an optional embodiment of the invention in which second stage 34 of pre-heater 30 is movably positionable with respect to first stage 32. As illustrated, second stage 34 may comprise a moveable arm or tube 37 through which heat from system 42 is directed. Preferably, such moveable arm or tube is positionable in both of the X- and Y-directions such that it may be positioned under various electronic components positioned at different locations on PCB 25. Thus, the system of FIG. 5 is particularly advantageous in directing focused heat to specific locations on the bottom of PCB 25. As such, this system may be used instead of (or to compliment) systems that move PCB 25 with respect to frame 11 (and thus move PCB 25 with respect to pre-heater 30).

In preferred aspects of the present invention, the heat (H1) supplied by heater 14 does not exceed 60% of the total heat (H1+H2+H3) supplied by heater 14, first stage 32 and second stage 34. This result can be achieved due to the focused heating (H3) of electronic component 20 delivered by second stage 34 from below. Specifically, focused heating from below (H3) reduces the amount of top heat (H1) that must be supplied from above (by heater 14) to cause solder reflow. As a result, the present system advantageously reduces the temperature differential through electronic component 20 in its Z-axis. In contrast, in preexisting systems, typically 80% of the total heat required to cause solder reflow is delivered from above.

The heated output of first stage 32 is especially useful during the early stages of the reflow process. Specifically, it is useful in heating PCB 25 to a temperature at which moisture is dried from electronic component 20 (around 100 degrees C.), and to a temperature at which the flux is activated (around 150 degrees C.). "Flux" is a material added to metal prior to soldering. "Activation of the flux" is the heating of this material to a temperature such that the oxides present in the material to be soldered are removed such that the solder wets to the base material.

A further advantage of the present system is that by providing localized heating of a particular component 20 on PCB 25, solder reflow is localized to that component, thus permitting easy removal and replacement of individual defective components.

In an exemplary aspect, first stage 32 heats PCB 25 to a generally uniform temperature just below the component board's solder reflow temperature, for example, in the range of 180 to 200 degrees Celsius. Second stage 34 then heats a focused area of PCB 25 to just below the component board's solder reflow temperature, for example, in the range of 210 to 220 degrees Celsius. The additional heat supplied by heater 14 then heats the focused area of PCB 25 it just above component board's solder reflow temperature, for example, above 230 degrees Celsius.

In one exemplary embodiment constructed by the present inventors, first stage 32 provides an even stream of hot air over an area up to 22 inches square, and second stage 34 provides an even stream of hot air over an area up to 10 inches square.

The present invention also provides a method of soldering or de-soldering electronic component 20 on PCB 25, comprising: positioning electronic component 20 on top of PCB 25; pre-heating the bottom of PCB 25 with dual-stage pre-heater 30 by: uniformly heating the bottom of PCB 25 with first stage 32 of pre-heater 30, and heating a focused region of PCB 25 directly below electronic component 20 with second stage 34 of pre-heater 30; and then heating the top of electronic component 20 with a heat source 14 positioned above electronic component 20. Preferably, the solder used is a lead free solder.

The present invention also provides a kit for soldering or de-soldering electronic component 20 on PCB 25, comprising the present system for component process re-work as described above; and instructions for use setting forth the present method as described above. Such instructions for use may be provided in written form, or may be stored electronically.

What is claimed is:

1. A system for electronic component processing, comprising:
   a frame configured to hold a printed circuit board;
   a tool head connected to the frame, the tool head being configured to position an electronic component on top of the printed circuit board;
   a heater disposed in the tool head, the heater being configured to direct heat towards the electronic component; and
   a dual-stage pre-heater connected to the frame, the dual-stage pre-heater being configured to direct heat towards the printed circuit board, wherein the pre-heater comprises:
      a first stage configured to direct heat over a wide area of the printed circuit board; and
      a second stage configured to heat a focused region of the printed circuit board adjacent to the electronic component.

2. The system of claim 1, wherein each of the first and second stages of the dual-stage pre-heater comprise forced air convection heaters.

3. The system of claim 2, wherein each of the first and second stages of the dual-stage pre-heater are positioned below the printed circuit board, and wherein first stage of the pre-heater is configured to generally uniformly heat the printed circuit board, and wherein the second stage of the pre-heater is configured to heat a focused region of the printed circuit board directly below the electronic component.

4. The system of claim 1, wherein each of the first and second stages of the dual-stage pre-heater are independently controllable.

5. The system of claim 2, wherein the first and second stages of the pre-heater are positioned to supply heated air flow concentric to one another.

6. The system of claim 5, further comprising:
   a focusing chamber connected to the output of the second stage of the pre-heater.

7. The system of claim 6, wherein the focusing chamber is conical shaped.

8. The system of claim 2, wherein the dual-stage pre-heater further comprises:
   a bowl, wherein each of the first and second stages of the pre-heater supply air flow into the bowl such that air flows in a vortex in the bowl.

9. The system of claim 8, wherein the bowl has two chambers, and wherein each of the first and second stages of the pre-heater supply air flow into the one of the chambers of the bowl.

10. The system of claim 2, wherein each of the first and second stages of the dual-stage pre-heater have dedicated heating elements and blowers.

11. The system of claim 2, wherein the heater in the tool head supplies less than 60% of the total heat directed towards the printed circuit board.

12. The system of claim 1, wherein the second stage of the dual-stage pre-heater is movably positionable with respect to the first stage of the dual-stage pre-heater.

13. A dual-stage pre-heater for heating a printed circuit board with an electronic component positioned thereon, comprising:
   a first forced air convection stage configured to uniformly heat a printed circuit board, and
   a second forced air convection stage configured to heat a focused region of the printed circuit board, wherein the first and second forced air convention stages direct air in the same direction.

14. The system of claim 13, wherein the first and second stages of the pre-heater are positioned to supply heated air flow concentric to one another.

15. The system of claim 14, further comprising:
   a focusing chamber connected to the output of the second stage of the pre-heater.

16. The system of claim 15, wherein the focusing chamber is conical shaped.

17. The system of claim 13, wherein each of the first and second stages of the dual-stage pre-heater have dedicated heating elements and blowers.

18. A dual-stage pre-heater for heating a printed circuit board with an electronic component positioned thereon, comprising:
   a first forced air convection stage configured to uniformly heat a printed circuit board, and
   a second forced air convection stage configured to heat a focused region of the printed circuit board, wherein the dual-stage pre-heater is configured to be connected to a component process assembly and re-work platform such that the dual-stage pre-heater directs air flow towards the bottom of the printed circuit board.

19. The dual-stage pre-heater of claim 18, wherein the first stage of the dual-stage pre-heater uniformly heats the bottom of the printed circuit board, and wherein the second stage of the dual-stage pre-heater heats a focused region of the printed circuit board directly below an electronic component positioned on the printed circuit board.

20. A dual-stage pre-heater for heating a printed circuit board with an electronic component positioned thereon, comprising:
   a first forced air convection stage configured to uniformly heat a printed circuit board, and
   a second forced air convection stage configured to heat a focused region of the printed circuit board, wherein the dual-stage pre-heater further comprises:
   a bowl, wherein each of the first and second stages of the pre-heater supply air flow into the bowl such that air flows in a vortex in the bowl.

21. The system of claim 20, wherein the bowl has two chambers, and wherein each of the first and second stages of the pre-heater supply air flow into the one of the chambers of the bowl.

22. A method of soldering or de-soldering an electronic component on a printed circuit board, comprising:
   positioning an electronic component on top of a printed circuit board;
   pre-heating the bottom of the printed circuit board with a dual-stage pre-heater by:
      uniformly heating the bottom of the printed circuit board with a first stage of the pre-heater, and
      heating a focused region of the printed circuit board directly below the electronic component with the second stage of the pre-heater, and then
   heating the top of the electronic component with a heat source positioned above the electronic component.

23. The method of claim 22, wherein the electronic component is positioned on top of a printed circuit board by a moveable tool head, and wherein the beat source positioned above the electronic component comprises a heat source disposed in the moveable tool head.

24. The method of claim 22, wherein the first stage of the pre-heater provides uniform heating of the printed circuit board, and wherein the heat source positioned above the electronic component and the second stage of the pre-heater provides focused top and bottom heating of the electronic component, respectively.

25. The method of claim 24, wherein the focused top and bottom heating of the electronic component causes solder between the electronic component and the printed circuit board to reflow.

26. The method of claim 25, wherein the solder is a lead free solder.

27. The method of claim 22, wherein heating with each stage of the dual-stage pre-heater comprises heating with a forced air convection system.

28. The method of claim 22, wherein the heat source positioned above the electronic component supplies less than 60% of the total heat directed towards the printed circuit board.

29. A kit for soldering or de-soldering an electronic component on a printed circuit board, comprising:
   the system for component process re-work and assembly set forth in claim 1; and
   instructions for use setting forth the method of claim 22.

30. A system for electronic component processing, comprising:
   a frame configured to hold a printed circuit board;
   a tool head connected to the frame, the tool head being configured to position an electronic component on top of the printed circuit board;
   a heater disposed in the tool head, the heater being configured to direct heat towards the electronic component; and
   a dual-stage pre-heater connected to the flame, the dual-stage pre-heater being configured to direct heat towards the printed circuit board, wherein the pre-heater comprises:
   a first heating stage; and
   a second heating stage, and wherein the first heating stage and the second heating stage are independently operable.

31. A system for electronic component processing, comprising:
   a frame configured to hold a printed circuit board;
   a tool head connected to the frame, the tool head being configured to position an electronic component on top of the printed circuit board;
   a heater disposed in the tool head, the heater being configured to direct heat towards the electronic component; and
   a dual-stage pre-heater connected to the frame, the dual-stage pre-heater being configured to direct heat towards the printed circuit board, wherein the pre-heater comprises:
   a first stage configured to distribute heat over a wide area; and
   a second stage configured to distribute heat over a focused area.

32. A dual-stage pre-heater for heating a printed circuit board with an electronic component positioned thereon, comprising:
   a first forced air convection stage configured to distribute heat over a wide area, and
   a second forced air convection stage configured to distribute heat over a focused area, wherein the first and second forced air convention stages direct air in the same direction.

33. A method of soldering or de-soldering an electronic component on a printed circuit board, comprising:
   positioning an electronic component on top of a printed circuit board;
   pre-heating the bottom of the printed circuit board with a dual-stage pre-heater by:
   uniformly heating the bottom of the printed circuit board, and
   heating a focused region of the printed circuit board directly below the electronic component; and then
   heating the top of the electronic component with a heat source positioned above the electronic component.

* * * * *